(12) United States Patent
Ko et al.

(10) Patent No.: US 9,870,920 B2
(45) Date of Patent: Jan. 16, 2018

(54) GROWING III-V COMPOUND SEMICONDUCTORS FROM TRENCHES FILLED WITH INTERMEDIATE LAYERS

(71) Applicant: Taiwan Semiconductor Manufacturing Company, Ltd., Hsin-Chu (TW)

(72) Inventors: Chih-Hsin Ko, Hsin-Chu (TW); Cheng-Hsien Wu, Hsin-Chu (TW); Clement Hsingjen Wann, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/926,976

(22) Filed: Oct. 29, 2015

(65) Prior Publication Data

US 2016/0049299 A1   Feb. 18, 2016

Related U.S. Application Data

(62) Division of application No. 14/260,713, filed on Apr. 24, 2014, now Pat. No. 9,209,023, which is a division of application No. 12/842,221, filed on Jul. 23, 2010, now Pat. No. 8,759,203.

(60) Provisional application No. 61/262,042, filed on Nov. 17, 2009.

(51) Int. Cl.
   *H01L 21/02* (2006.01)

(52) U.S. Cl.
   CPC .... *H01L 21/02647* (2013.01); *H01L 21/0254* (2013.01); *H01L 21/02381* (2013.01); *H01L 21/02389* (2013.01); *H01L 21/02458* (2013.01); *H01L 21/02463* (2013.01); *H01L 21/02546* (2013.01); *H01L 21/02617* (2013.01); *H01L 21/02639* (2013.01)

(58) Field of Classification Search
   CPC ... H01L 21/02617; H01L 21/02636–21/02653
   See application file for complete search history.

(56) References Cited

U.S. PATENT DOCUMENTS

| 6,111,277 A | 8/2000 | Ikeda |
| 7,198,971 B2 | 4/2007 | Shin |
| 8,375,349 B2 | 2/2013 | Wann |

(Continued)

OTHER PUBLICATIONS http://www.epistar.com.tw/img/pdf/ES-CADBV45B.pdf, "InGaN Venus Blue LED Chip," ES-CADBV45B, Epistar Corporation, 2008, CC-200807-B, 2 pgs.

(Continued)

*Primary Examiner* — Laura Menz
*Assistant Examiner* — Candice Y Chan
(74) *Attorney, Agent, or Firm* — Slater Matsil, LLP

(57) ABSTRACT

A method of forming an integrated circuit structure includes forming an insulation layer over at least a portion of a substrate; forming a plurality of semiconductor pillars over a top surface of the insulation layer. The plurality of semiconductor pillars is horizontally spaced apart by portions of the insulation layer. The plurality of semiconductor pillars is allocated in a periodic pattern. The method further includes epitaxially growing a III-V compound semiconductor film from top surfaces and sidewalls of the semiconductor pillars.

20 Claims, 11 Drawing Sheets

(56) References Cited

U.S. PATENT DOCUMENTS

| | | | |
|---|---|---|---|
| 8,377,796 | B2 | 2/2013 | Yu et al. |
| 2003/0006438 | A1 | 1/2003 | Arima |
| 2003/0092263 | A1 | 5/2003 | Koike et al. |
| 2003/0119239 | A1 | 6/2003 | Koike et al. |
| 2005/0064206 | A1 | 3/2005 | Akita et al. |
| 2005/0086619 | A1 | 4/2005 | Teh et al. |
| 2009/0261363 | A1* | 10/2009 | Chen ............ H01L 21/02381 257/95 |

OTHER PUBLICATIONS

Davari, B., et al., "CMOS Scaling for High Performance and Low Power—The Next Ten Years," Proceedings of the IEEE, vol. 83, No. 4, Apr. 1995, pp. 595-606.

Haensch, W., et al., "Silicon CMOS Devices Beyond Scaling," IBM J. Res. & Dev., vol. 50, No. 4/5, Jul./Sep. 2006, pp. 339-361A.

Hiramatsu, K. et al., "Fabrication and characterization of low defect density GaN using facet-controlled epitaxial lateral overgrowth (FACELO)," Journal of Crystal Growth, 221(2000), pp. 316-326, Elsevier Science B.V.

Horowitz, M., et al., "Scaling, Power, and the Future of CMOS," IEEE, 2005, 7 pages.

http://www.epistar.com.tw/img/pdf/ES-CEBHM12A.pdf, "InGaN Blue LED Chip," ES-CEBHM12A, Epistar Corporation, 2008, CC-200812-A, 1 pg.

http://www.epistar.com.tw/img/pdf/ES-CEBLV13.pdf, "InGaN Venus Blue Chip," ES-CEBLV13, Epistar Corporation, 2008, CC-200810-A, 1 pg.

http://www.epistar.com.tw/img/pdf/ES-CADBV24B.pdf, "InGaN Venus Blue LED Chip," ES-CADBV24B, Epistar Corporation, 2008, CC-200810-A, 2 pgs.

White, Mark, et al., "Scaled CMOS Technology Reliability Users Guide," Jet Propulsion Laboratory Publication 08-14 3/08, 2008, 27 pages.

Zamir, S. et al., "Lateral confined epitaxy of GaN layers on Si substrates," Journal of Crystal Growth 230 (2001), pp. 341-345, Elsevier Science B.V.

Zubia, D. et al., "Nanoheteroepitaxy: The Application of nanostructuring and substrate compliance to the heteroepitaxy of mismatched semiconductor materials," Journal of Applied Physics, Vo. 85, No. 9, May 1, 1999, pp. 6492-6496.

* cited by examiner

GROWING III-V COMPOUND SEMICONDUCTORS FROM TRENCHES FILLED WITH INTERMEDIATE LAYERS

This application is a divisional of U.S. patent application Ser. No. 14/260,713, entitled "Growing III-V Compound Semiconductors from Trenches Filled with Intermediate Layers," filed Apr. 24, 2014, which application is a divisional of U.S. patent application Ser. No. 12/842,221, entitled "Growing III-V Compound Semiconductors from Trenches Filled with Intermediate Layers," filed on Jul. 23, 2010, now U.S. Pat. No. 8,759,203, which application claims the benefit of U.S. Provisional Application No. 61/262,042 filed on Nov. 17, 2009, entitled "Growing III-V Compound Semiconductors from Trenches Filled with Intermediate Layers," which applications are hereby incorporated herein by reference.

TECHNICAL FIELD

This disclosure relates generally to integrated circuit manufacturing processes, and more particularly to forming group-III group-V (III-V) compound semiconductor films.

BACKGROUND

Group-III group-V compound semiconductors (often referred to as III-V compound semiconductors) such as gallium nitride (GaN) and their related alloys have been under intense research in recent years due to their promising applications in electronic and optoelectronic devices. Particular examples of potential optoelectronic devices employing III-V compound semiconductors include blue light emitting diodes and laser diodes, and ultra-violet (UV) photo-detectors. The large bandgap and high electron saturation velocity of many III-V compound semiconductors also make them excellent candidates for applications in high temperature and high-speed power electronics.

Epitaxially grown GaN films are widely used for in the fabrication of light-emitting diodes. Unfortunately, epitaxial GaN films must be grown on substrates other than GaN because it is extremely difficult to obtain GaN bulk crystals due to the high equilibrium pressure of nitrogen at the temperatures typically used to grow bulk crystals. Owing to the lack of feasible bulk growth methods for GaN substrates, GaN is commonly deposited epitaxially on dissimilar substrates such as silicon, SiC and sapphire ($Al_2O_3$). However, the growth of GaN films on dissimilar substrates is difficult because these substrates have lattice constants and thermal expansion coefficients different than that of GaN. If the difficulties in the growth of GaN films on silicon substrates could be overcome, silicon substrates would be attractive for GaN growth given their low cost, large diameter, high crystal and surface quality, controllable electrical conductivity, and high thermal conductivity. The use of silicon substrates would also provide easy integration of GaN based optoelectronic devices with silicon-based electronic devices.

Additionally, due to the lacking of appropriate substrates for growing GaN films thereon, the sizes of the GaN films are limited. The high stresses created by growing a GaN film on a dissimilar substrate may cause the substrate to bow. This may cause several adverse effects. Firstly, a great number of defects (dislocations) will be generated in the supposedly crystalline GaN films. Secondly, the thicknesses of the resulting GaN film will be less uniform, causing wavelength shifts of the light emitted by the optical devices formed on the GaN films. Thirdly, cracks may be generated in large stressed GaN films.

SUMMARY

In accordance with one aspect of the embodiment, a method of forming an integrated circuit structure includes forming an insulation layer over at least a portion of a substrate; forming a plurality of semiconductor pillars over a top surface of the insulation layer. The plurality of semiconductor pillars is horizontally spaced apart by portions of the insulation layer. The plurality of semiconductor pillars is allocated in a periodic pattern. The method further includes epitaxially growing a III-V compound semiconductor film from top surfaces and sidewalls of the semiconductor pillars.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming group-III group-V (referred to as III-V hereinafter) compound semiconductor films is provided. Throughout the description, the term "III-V compound semiconductor" refers to compound semiconductor materials comprising at least one group-III element and one group-V element. The term "III-N compound semiconductor" refers to a III-V compound semiconductor comprising nitrogen. The required stages of manufacturing an illustrative embodiment are illustrated. Those skilled in the art will recognize that other manufacturing steps may need to take place before or after the described stages in order to produce a complete device. Throughout the various views and illustrative embodiments of the disclosure, like reference numbers are used to designate like elements.

Figure 1A:
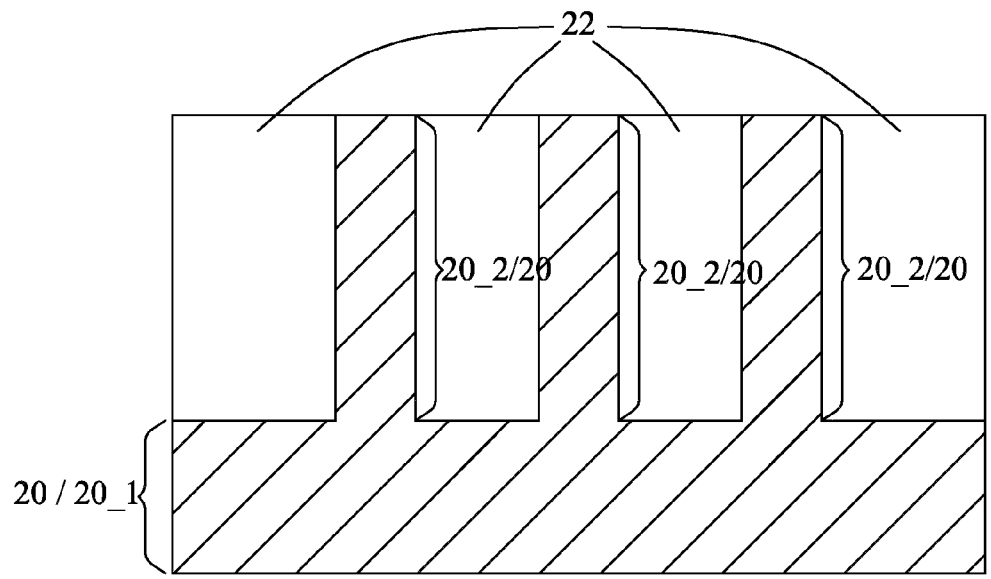
FIGS. 1A through 8 illustrate cross-sectional views, a perspective view, and a top view of intermediate stages in the manufacturing of a III-V semiconductor film in accordance with an embodiment.

Referring to FIG. 1A, substrate 20 is provided. In an embodiment, substrate 20 is a bulk substrate comprising, for example, semiconductor material(s) such as silicon. Substrate 20 may be formed of other commonly used materials such as sapphire, SiGe, SiC, Ge, or the like. Insulation regions 22 (which may be considered as portions of an insulation layer) are formed in substrate 20. In an embodiment, the insulation regions may include shallow trench isolation (STI) region(s) 22, and hence are referred to as STI regions 22 throughout the description. The formation process of STI regions 22 may include recessing portions of substrate 20, and filling the resulting recesses with a dielectric material, followed by a chemical mechanical polish (CMP) to remove excess dielectric material. The remaining portions of the dielectric material form STI regions 22. In the resulting structure, substrate 20 may include portion 20_1 that is below the bottom surfaces of STI regions 22, and portions 20_2 that are between, and separated from each other by, STI regions 22. It is noted that although STI regions 22 were originally formed in substrate 20, substrate portion 20_1 may also be treated as a substrate, while STI regions 22 may be treated as being over substrate 20_1.

Figure 1B:
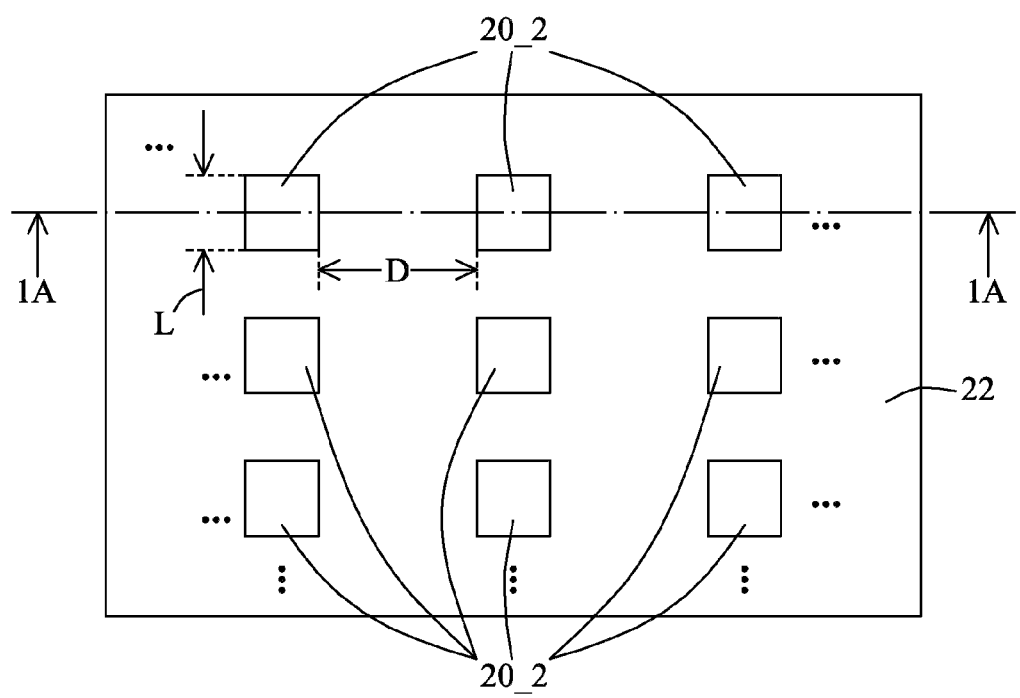
Figure 5A:
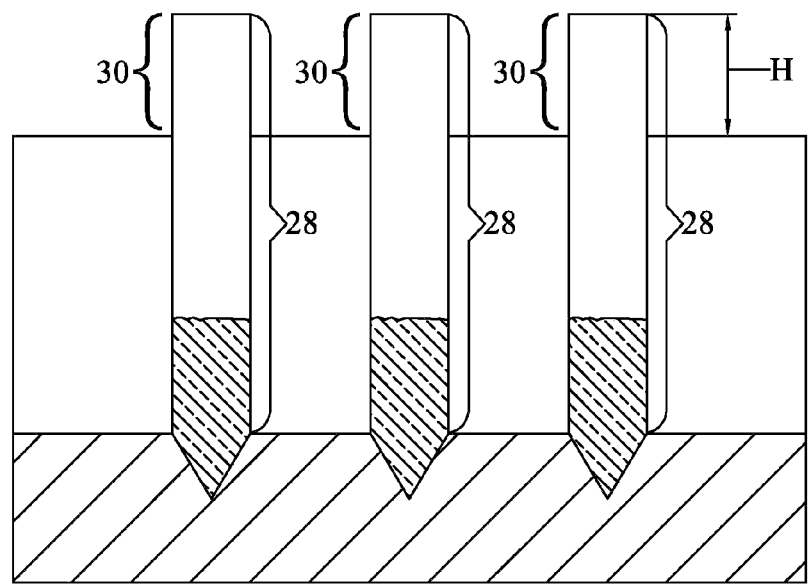

FIG. 1B illustrates a top view of the structure shown in FIG. 1A, wherein the cross-sectional view in FIG. 1A is obtained from the plane crossing line 1A-1A in FIG. 1B. From the top view, it is observed that substrate portions 20_2 are arranged in a periodic pattern. In an exemplary embodiment as shown in FIG. 1B, substrate portions 20_2 are arranged as an array, in other embodiments, substrate portions 20_2 may be arranged in other patterns such as a hexagon pattern. Distance D between neighboring substrate portions 20_2 may be less than about 5 μm, and may also be between about 20 nm and about 5 μm. The length and/or width L of substrate portions 20_2 (which will also be the length and/or width of the resulting semiconductor re-growth regions 28 and (semiconductor) pillars 30, as shown in FIG. 5A) may be smaller than about 5 μm. One skilled in the art will realize, however, that the dimensions recited throughout the description are merely examples, and will change if different formation technologies are used. From the top view, substrate portions 20_2 may have the shape of square, rectangle, circle, hexagon, octagon, or the like.

Figure 2:
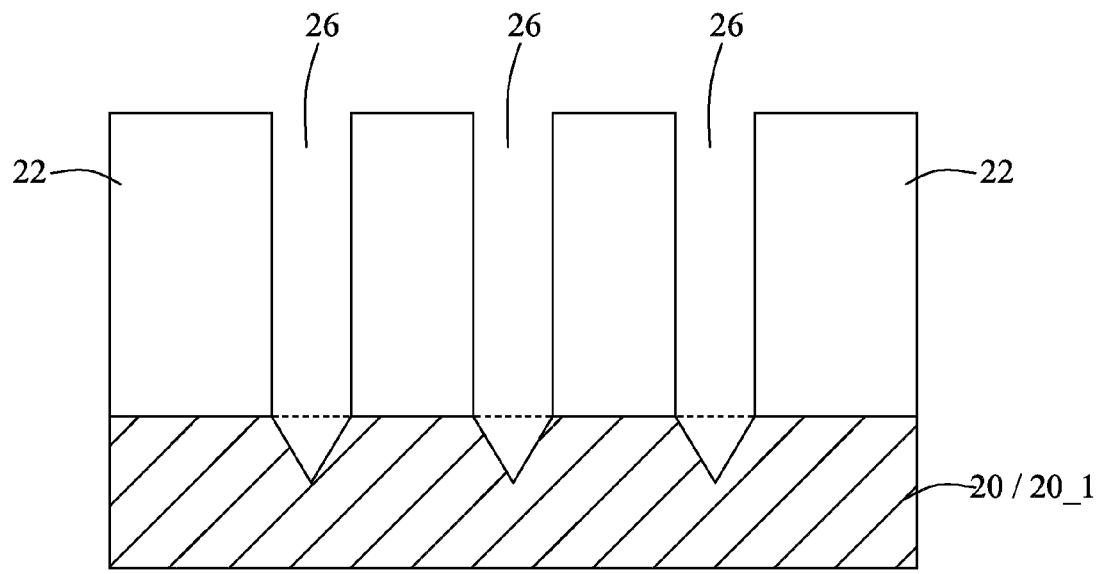

Referring to FIG. 2, substrate portions 20_2 are removed partially or fully, forming recesses 26. In an embodiment as shown in FIG. 2, V-grooves may be formed at the bottom of recesses 26, so that the exposed surface of silicon substrate 20 in recesses 26 have (111) surface orientations. In alternative embodiments, as shown with dotted lines, the bottom surfaces of recesses 26 may be substantially flat.

Figure 3:
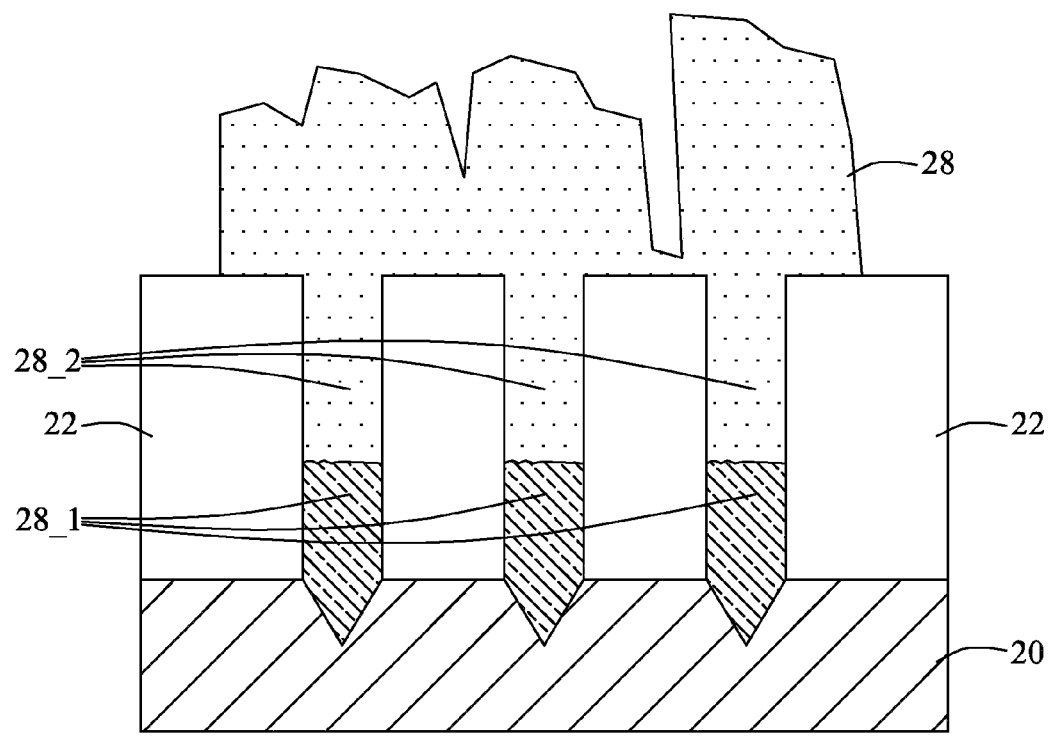
Figure 4:
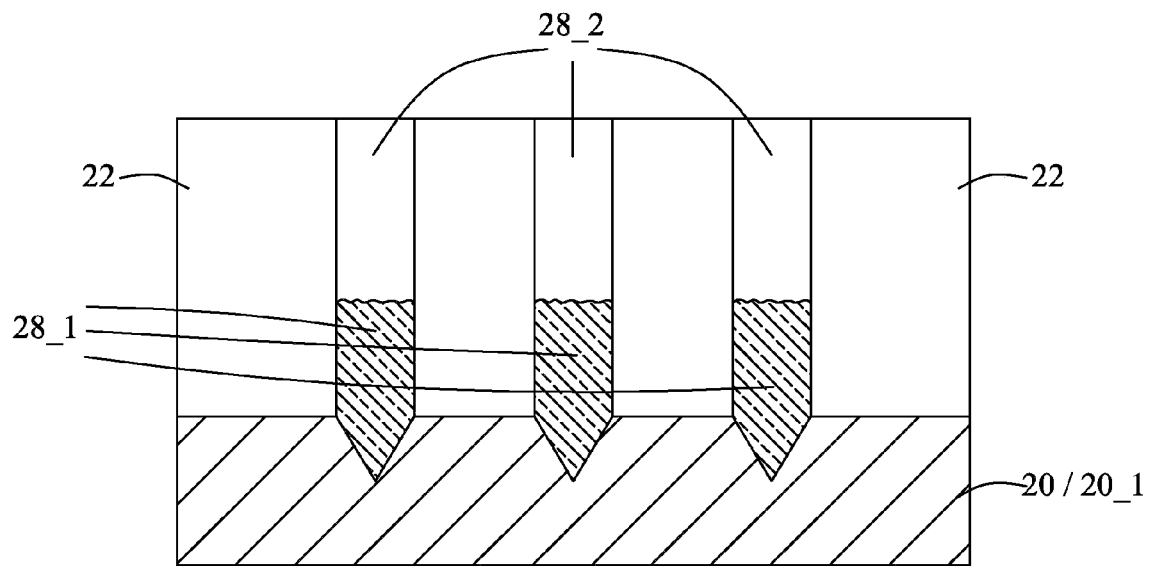
Figure 6:
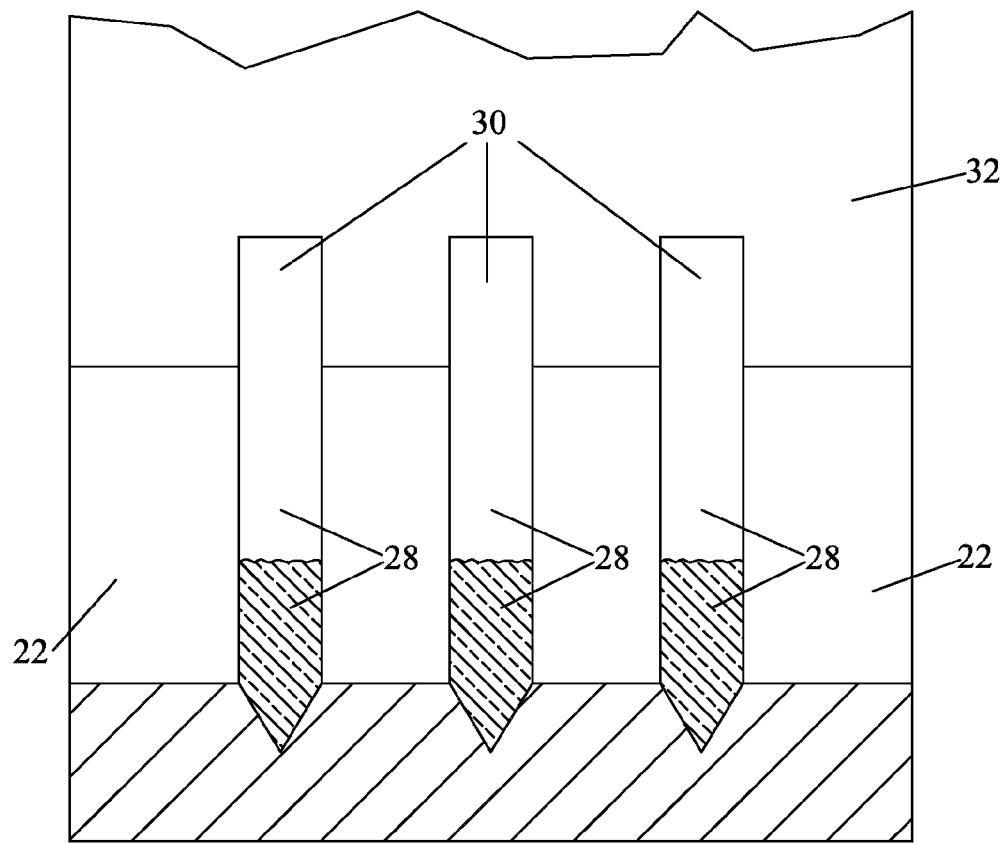

Next, as shown in FIG. 3, semiconductor re-growth regions 28 are epitaxially grown in recesses 26. Semiconductor re-growth regions 28 may be formed of a material having a lattice constant between the lattice constant of substrate 20 and the lattice constant of the overlying III-V semiconductor film 32 (not shown in FIG. 3, please refer to FIG. 6). In an embodiment, semiconductor re-growth regions 28 comprise buffer regions 28_1 and top regions 28_2. Buffer regions 28_1 may be formed of AlN, low temperature GaAs, or a low temperature GaAs and a high temperature GaAs on the low temperature GaAs. The low temperature GaAs may be epitaxially grown at a temperature lower than about 400° C., while the high temperature GaAs may be epitaxially grown at a temperature higher than about 600° C. Alternatively, buffer regions 28_1 may be formed of a low temperature GaN or AlN, which may be epitaxially grown at a temperature lower than about 850° C. Top regions 28_2 may be formed of GaN, which may be epitaxially grown at a temperature higher than about 1100° C. By growing semiconductor re-growth regions 28 in recesses 26, the threading dislocations may be blocked by the sidewalls of STI regions 22, so that fewer defects will occur in subsequently formed III-V semiconductor film 32 (FIG. 6). Next, a CMP is performed to remove excess semiconductor re-growth regions 28. The resulting structure is shown in FIG. 4.

Figure 5B:
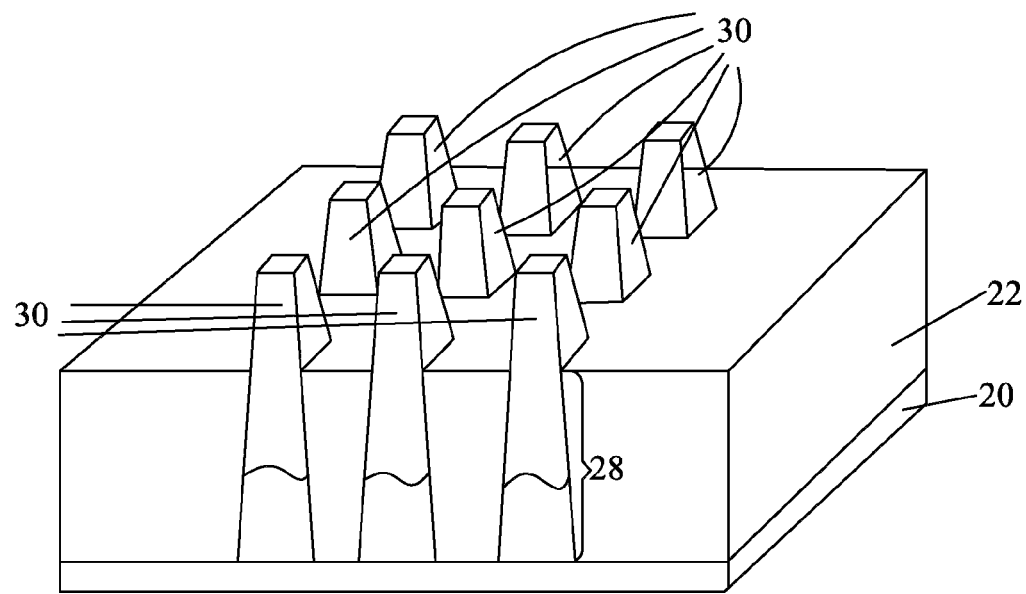

FIG. 5A illustrates the recessing of STI regions 22. As a result, the portions of re-growth regions 28 over the top surfaces of remaining portions of STI regions 22 form pillars 30. The height H of pillars 30 may be greater than about 50 nm, or even greater than about 100 nm. FIG. 5B illustrates a perspective view of the structure shown in FIG. 5A.

Referring to FIG. 6, III-V compound semiconductor film 32 is epitaxially grown. In an embodiment, III-V compound semiconductor film 32 comprises GaAs, although it may also be formed of other III-V compound semiconductor materials such as GaN, InN, AN, InP, or the like. With III-V compound semiconductor film 32 grown from the top surface and sidewalls of pillars 30, the defect density in III-V compound semiconductor film 32 may be reduced. A planarization (for example, a CMP) may then be performed to flatten the top surface of III-V compound semiconductor film 32.

Figure 7:
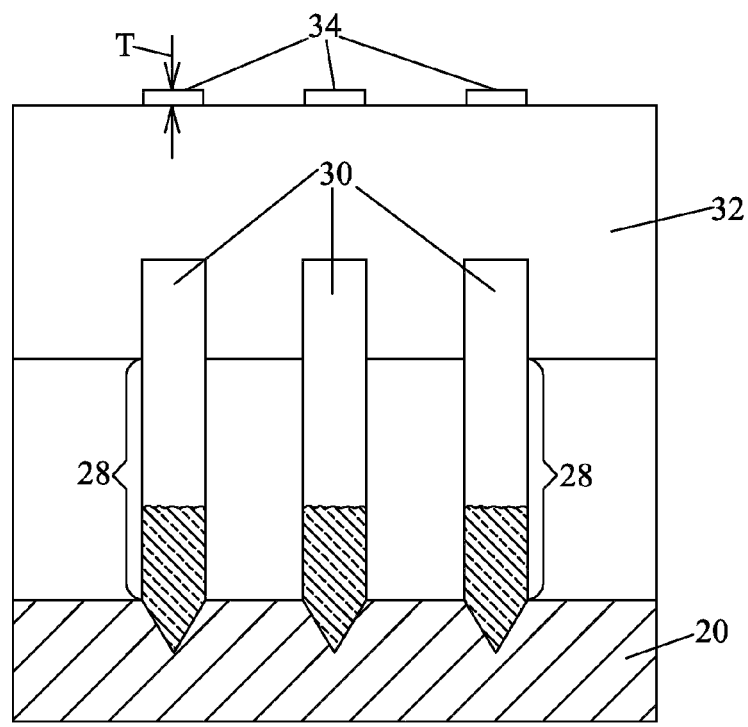

Optionally, as shown in FIG. 7, mask layer 34 is formed on III-V compound semiconductor film 32. Mask layer 34 may include a material selected from dielectric materials such as silicon nitride or silicon oxide. Mask layer 34 may also include multi-layers of the above-discussed materials. The applicable deposition methods for forming mask layer 34 include physical vapor deposition (PVD) and chemical vapor deposition (CVD).

Mask layer 34 is patterned so that the top surface of III-V compound semiconductor film 32 is selectively exposed through the gaps between remaining portions of mask layer 34. The patterning may be performed using a dry etch and/or a wet etch. The remaining portions of mask layer 34 may have any pattern with controlled width and spacing, and may form parallel strips. In other embodiments, the remaining portions of mask layer 34 may be arranged as an array or other periodic patterns, with each remaining portion having a square, a strip, or a polygon shape (in a top view). In yet other embodiments, the remaining portions of mask layer 34 may form an interconnected grid structure, with windows therein for exposing the underlying III-V compound semiconductor film 32. The thickness T of mask layer 34 may be about 2 nm to about 6 μm.

Figure 8:
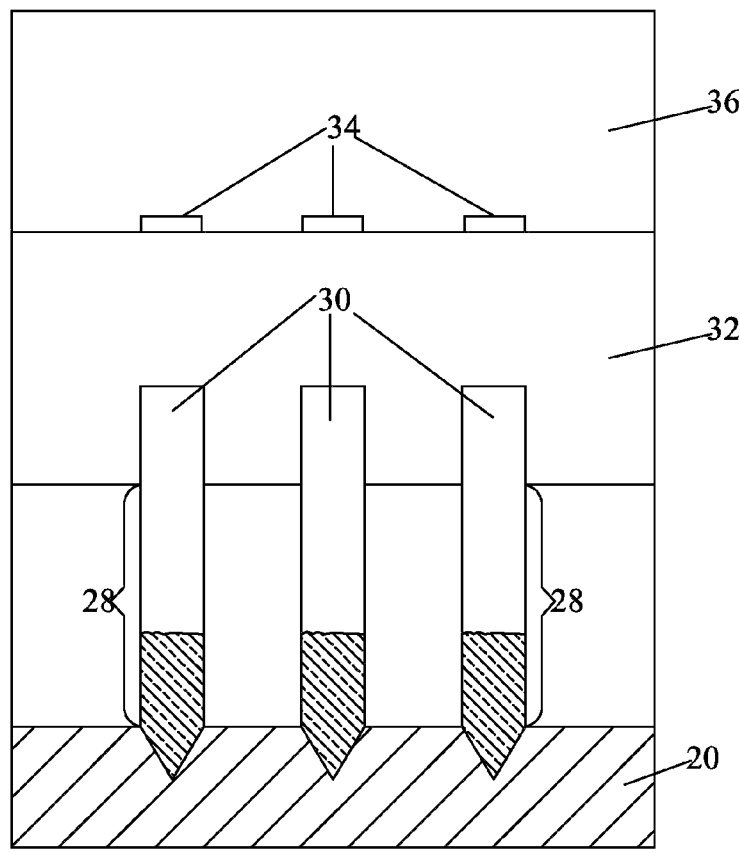

Next, as shown in FIG. 8, an additional III-V semiconductor film 36 is grown on the exposed surface of III-V compound semiconductor film 32, for example, using epitaxial layer overgrowth (ELOG). With the formation of mask layer 34 and the ELOG step, the defect density in III-V semiconductor film 36 is lower than in III-V compound semiconductor film 32. In an embodiment, III-V semiconductor film 36 may be formed of a same material as that of III-V compound semiconductor film 32, for example, GaN. Alternatively, III-V semiconductor films 32 and 36 may be formed of different materials, for example, III-V compound semiconductor film 32 may be formed of GaAs, while III-V semiconductor films 36 may be formed of GaN. In subsequent process steps, III-V semiconductor film 36 may be planarized. Further, the underlying substrate 20 and STI regions 22 may be removed, for example, using CMP. The resulting structure is thus a bulk III-V substrate (for example, a GaN substrate) with a low defect density.

Figure 9:
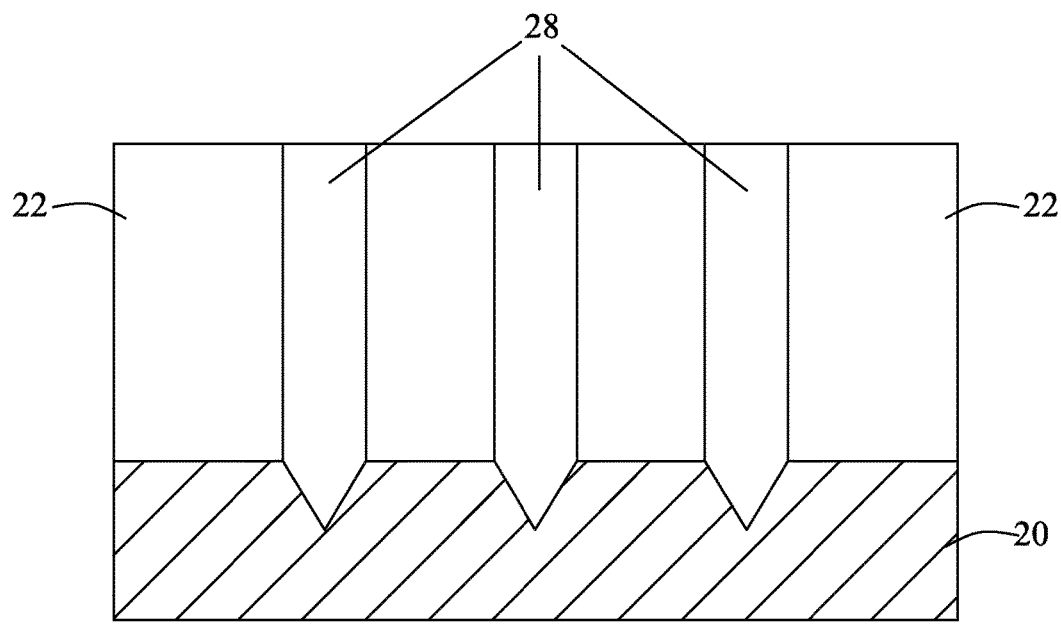
FIG. 9 through 18 are cross-sectional views and a perspective view of intermediate stages in the manufacturing of III-V semiconductor films in accordance with alternative embodiments.
Figure 10:
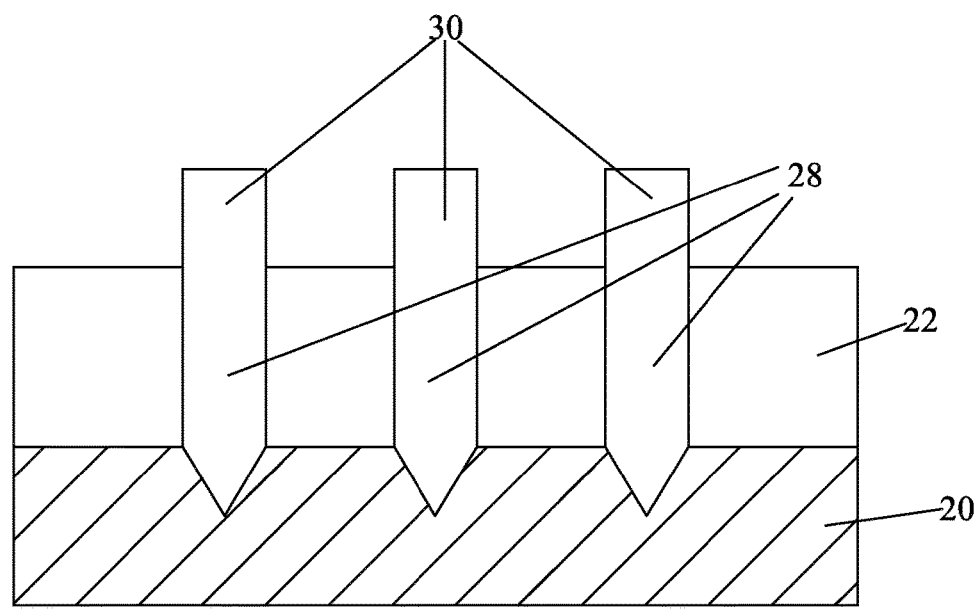
Figure 11:
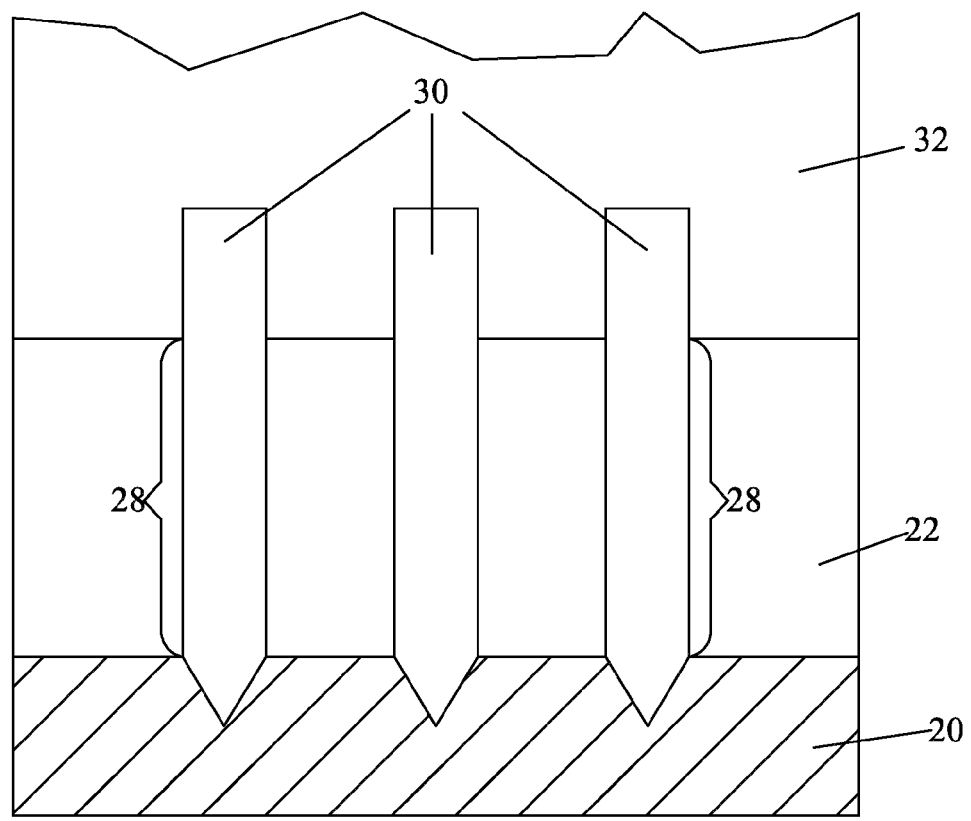

FIGS. 9 through 11 illustrate an alternative embodiment. Unless specified otherwise, like reference numerals in this embodiment (and subsequently discussed embodiments) represent like components in the embodiment shown in FIGS. 1A through 8. Accordingly, the process steps and applicable materials may not be repeated herein. The initial steps of this embodiment are essentially the same as shown in FIGS. 1A through 2. Next, as shown in FIG. 9, semiconductor re-growth regions 28 are formed in the form of a single layer, with the top portions and the bottom portions formed of a same semiconductor material. In an embodiment, semiconductor re-growth regions 28 are formed of epitaxial GaAs.

Referring to FIG. 10, STI regions 22 are recessed, so that pillars 30, which extend above the top surfaces of STI regions 22, are formed. In subsequent steps, III-V compound semiconductor film 32 is formed, as shown in FIG. 11. Optionally, III-V semiconductor film 36 is formed. The process steps and the materials of III-V semiconductor films 32 and 36 may be essentially the same as shown in FIGS. 7 and 8 and the respective discussion, and hence are not repeated herein.

Figure 12:
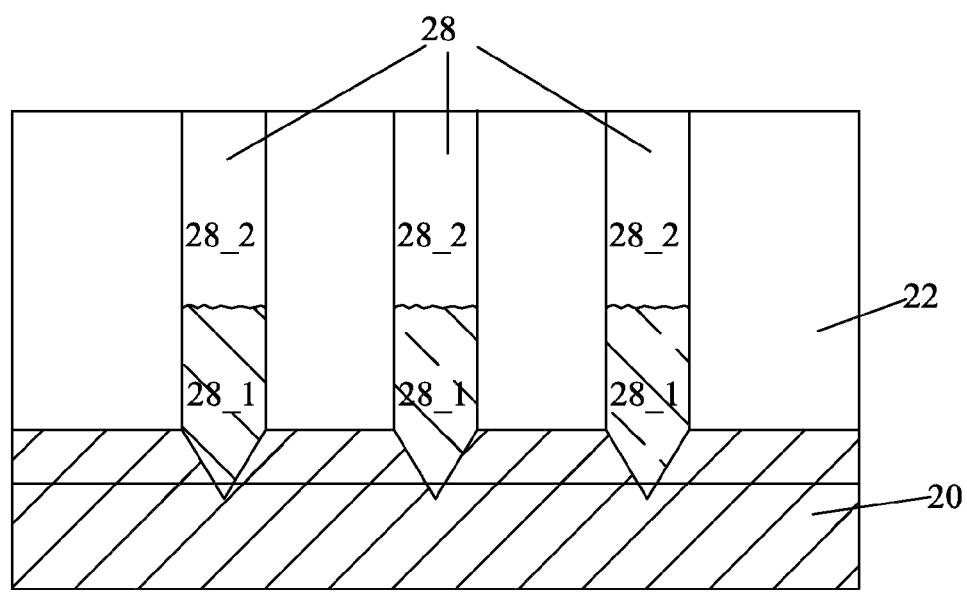
Figure 13:
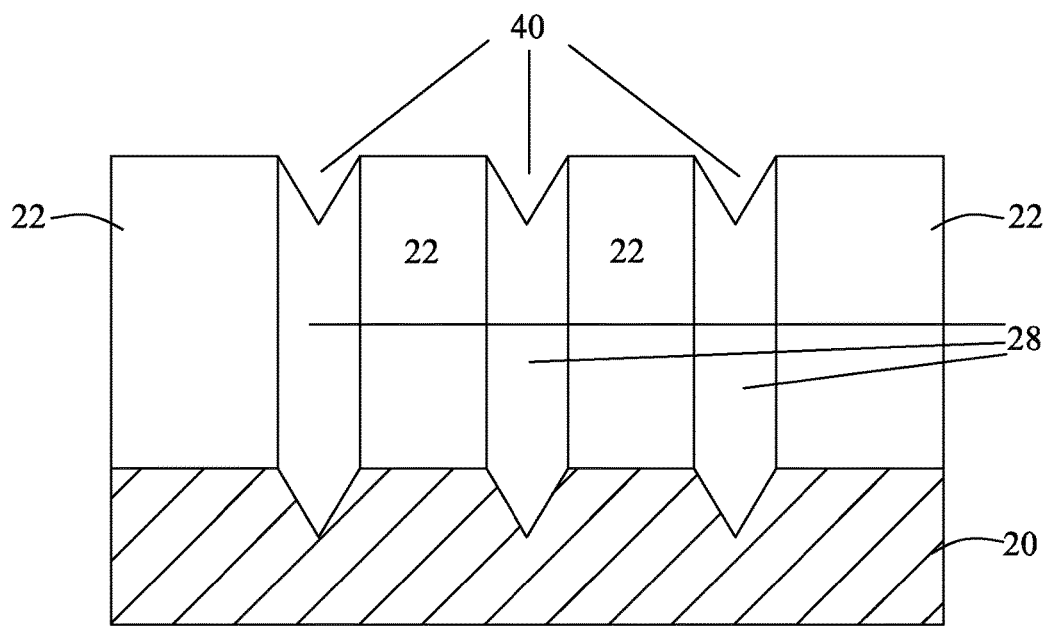
Figure 14:
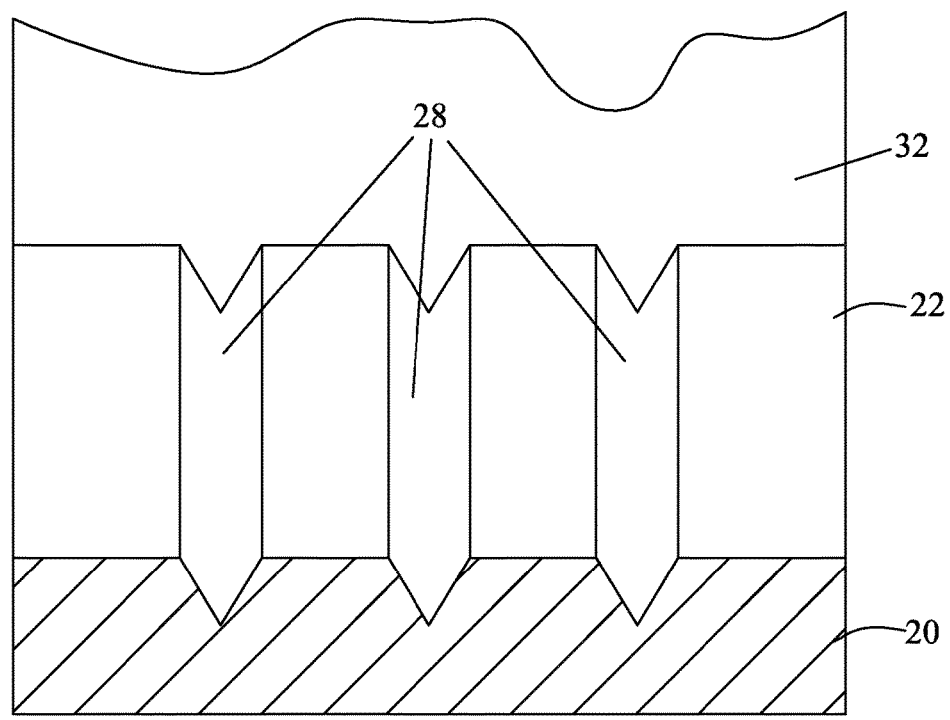

FIGS. 12 through 14 illustrate yet another embodiment. The initial steps of this embodiment are essentially the same as shown in FIGS. 1A through 2. Next, as shown in FIG. 12, semiconductor re-growth regions 28 are formed. Semiconductor re-growth regions 28 may be composite regions comprising buffer regions 28_1 and top regions 28_2, as shown in FIG. 3, or regions formed of a single material, as shown in FIG. 9. In an embodiment, semiconductor re-growth regions 28 are formed of epitaxial GaAs, although other semiconductor materials such as GaN may be used. Next, as shown in FIG. 13, an isotropic etch is performed to semiconductor re-growth regions 28, for example, using KOH, so that V-grooves 40 are formed. The exposed surfaces of semiconductor re-growth regions 28 may have (111) surface planes. In the embodiments in which re-growth regions 28 are formed of GaAs, the (111) surface planes may have a smaller lattice mismatch with the overlying III-V compound semiconductor film 32 (which may be formed of GaN, for example, see FIG. 14) than the flat top surfaces of semiconductor re-growth regions 28 as shown in FIG. 12. As a result, fewer defects may be generated in the subsequently formed III-V compound semiconductor film 32. Next, III-V compound semiconductor film 32 is formed, as shown in FIG. 14. Process steps as shown in FIGS. 7 and 8 may then be performed to form III-V semiconductor film 36.

Figure 15A:
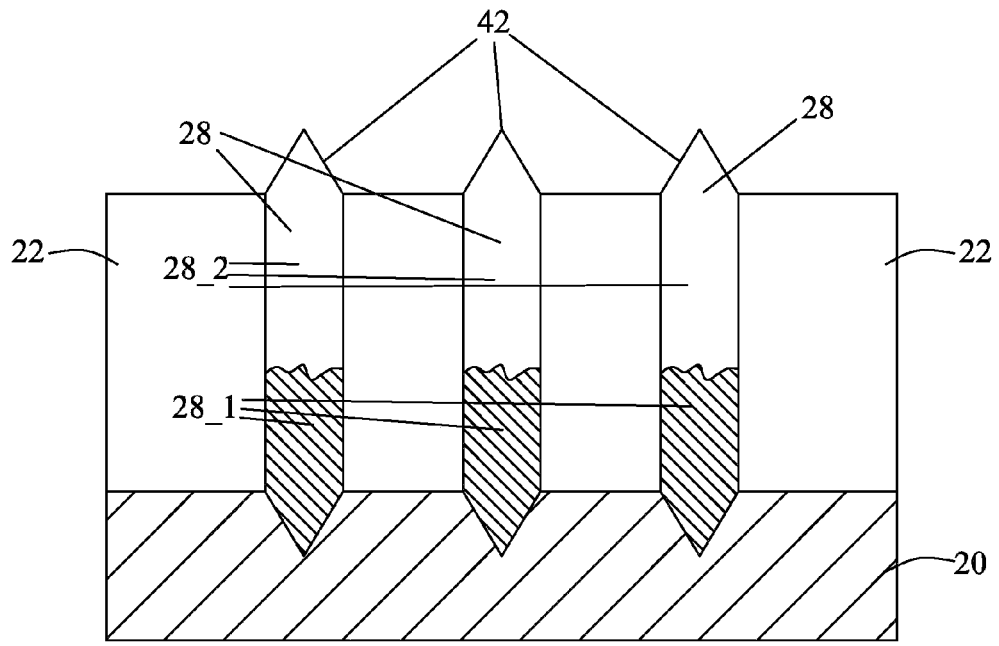
Figure 15B:
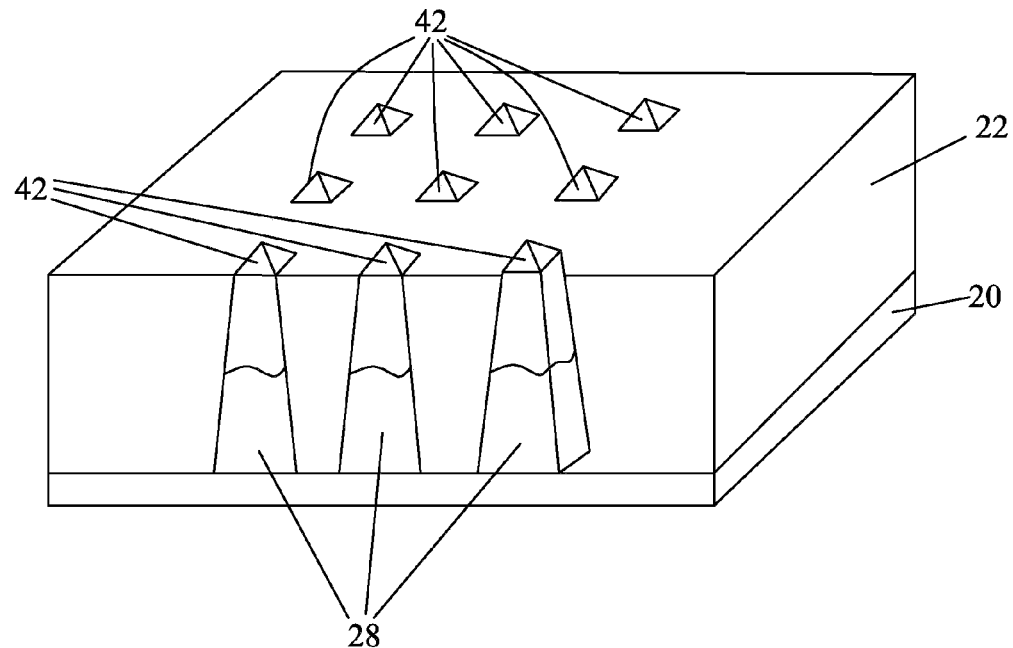
Figure 16:
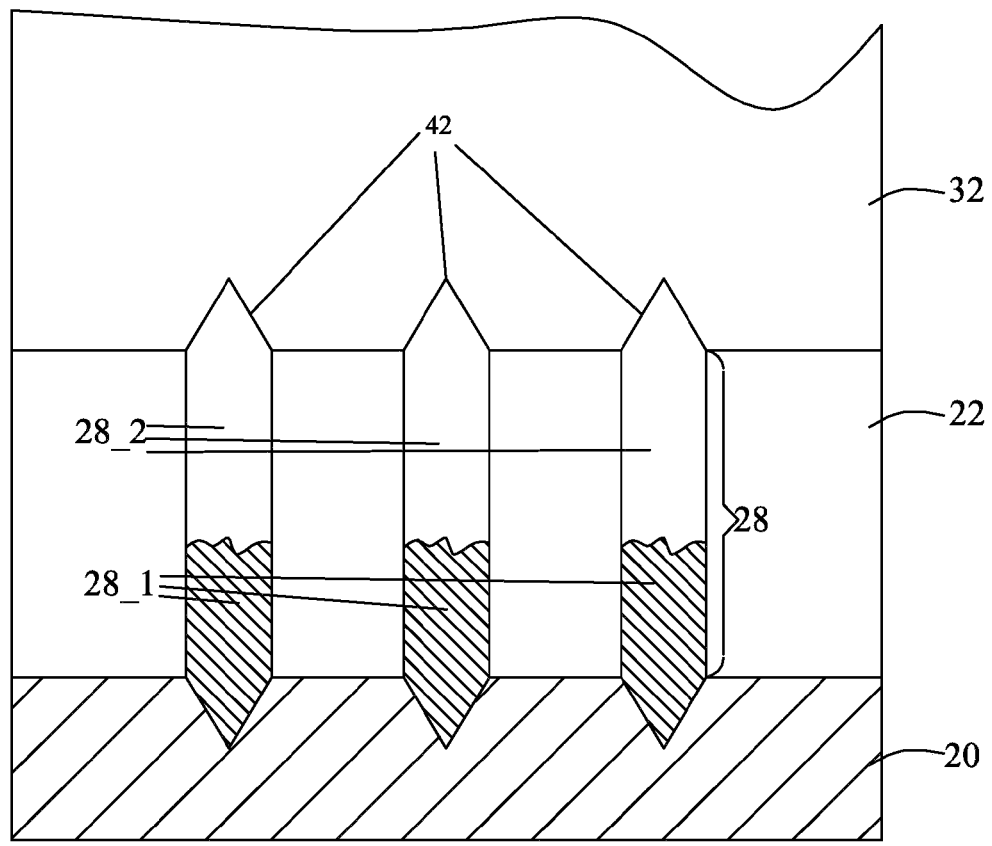

FIGS. 15A through 16 illustrate yet another embodiment. The initial steps of this embodiment are essentially the same as shown in FIGS. 1A through 2. Next, as shown in FIG. 15A, semiconductor re-growth regions 28 are formed. Semiconductor re-growth regions 28 may be composite regions comprising buffer regions 28_1 and top regions 28_2, as shown in FIG. 3, or a formed of a single layer, as shown in FIG. 9. In an embodiment, top regions 28_2 are formed of epitaxial GaN, although other materials such as GaAs may be used. The partial pressures of process gases, temperature, and formation time may be adjusted, so that pyramids 42 are formed, wherein pyramids 42 may have bases substantially level with the top surfaces of STI regions 22. The exposed surfaces (slopes) of semiconductor re-growth regions 28 may have the (111) surface-planes. FIG. 15B illustrates the perspective view of the structure shown in FIG. 15A.

Next, as shown in FIG. 16, III-V compound semiconductor film 32 is epitaxially grown. III-V compound semiconductor film 32 and top regions 28_2 may be formed of a same material or different materials. With III-V compound semiconductor film 32 grown starting from the slopes of pyramids 42, the threading dislocations in III-V compound semiconductor film 32 may bend toward, and end at, the top surfaces of STI regions 22. As a result, fewer defects will be generated in III-V compound semiconductor film 32. In the embodiment III-V compound semiconductor film 32 and top regions 28_2 are formed of a same material such as GaN, III-V compound semiconductor film 32 may be formed at a temperature higher than the temperature for forming top regions 28_2.

Figure 17:
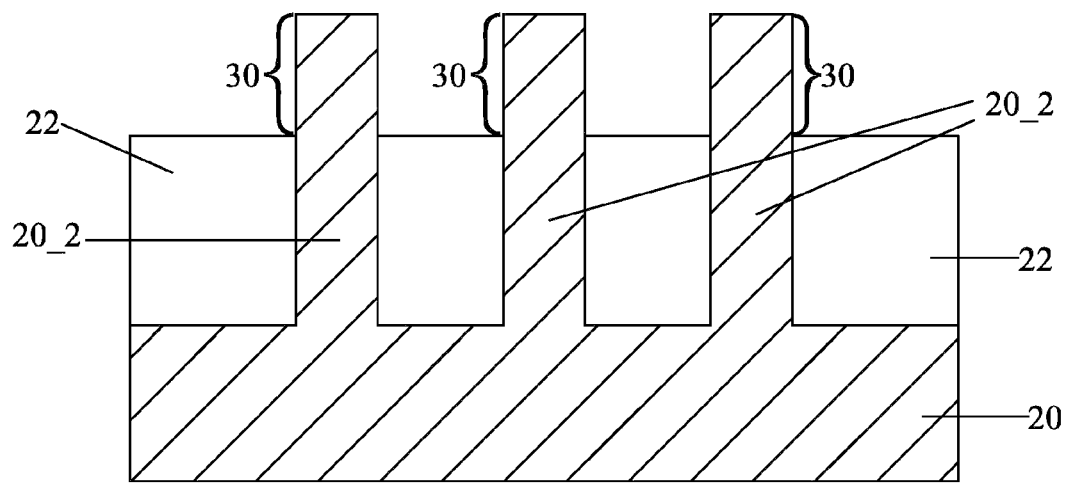
Figure 18:
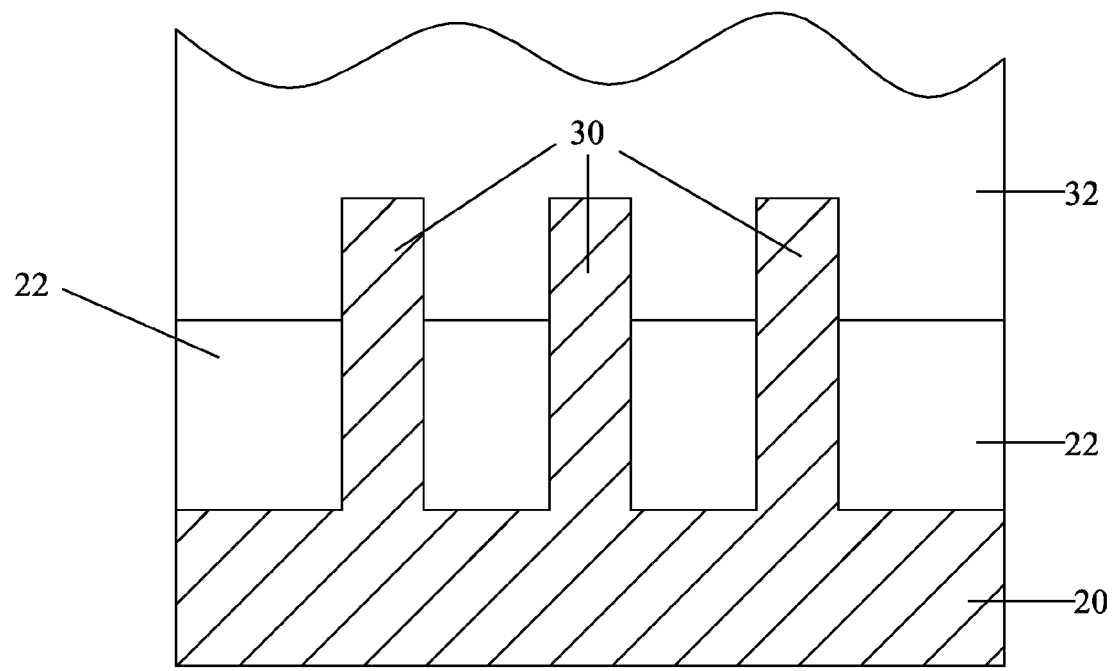

FIGS. 17 and 18 illustrate yet another embodiment. The initial steps of this embodiment are essentially the same as shown in FIGS. 1A and 1B. Next, as shown in FIG. 17, STI regions 22 are recessed, so that the top portions 20_2 of substrate 20 form pillars 30. Next, III-V compound semiconductor film 32 is epitaxially grown, as shown in FIG. 18. The process steps as shown in FIGS. 7 and 8 may then be optionally performed.

In the above-discussed embodiments, by starting the growth of III-V compound semiconductor film 32 from periodic patterned semiconductor re-growth regions 28, the defect numbers in the resulting III-V compound semiconductor film 32 may be reduced. Further, with the top surface of re-growth regions 28 being V-grooves 40 or pyramids 42, the defect numbers may be further reduced.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming an insulation layer in a substrate, with portions of the substrate in, and separate from each other by, the insulation layer;
    removing the portions of the substrate to form recesses in the insulation layer;
    epitaxially growing a semiconductor material in the recesses to form semiconductor re-growth regions, wherein top ends of the semiconductor re-growth regions form pyramids; and
    epitaxially growing a III-V compound semiconductor film starting from the pyramids.

2. The method of claim 1, wherein the semiconductor re-growth regions and the III-V compound semiconductor film comprise GaN.

3. The method of claim 1, wherein the recesses in the insulation layer extend into a semiconductor substrate and form V-grooves, and the semiconductor material is grown from the V-grooves.

4. The method of claim 1, wherein surfaces of the pyramids have (111) surface orientations.

5. The method of claim 1, wherein bases of the pyramids are substantially level with a top surface of the insulation layer.

6. The method of claim 1, wherein the semiconductor re-growth regions comprise buffer regions, and top regions over the buffer regions, and wherein the top regions are formed of different materials than the buffer regions.

7. The method of claim 6, wherein top surfaces of the buffer regions are lower than a top surface of the insulation layer.

8. The method of claim 1 further comprising:
forming a patterned mask layer over the III-V compound semiconductor film, with portions of the III-V compound semiconductor film exposed through the patterned mask layer; and
epitaxially growing an additional III-V compound semiconductor film from exposed portions of the III-V compound semiconductor film.

9. The method of claim 1, wherein the semiconductor re-growth regions and the III-V compound semiconductor film are formed of a same III-V compound semiconductor material, and the III-V compound semiconductor film is grown at a temperature higher than a temperature for forming the semiconductor re-growth regions.

10. A method comprising:
forming an isolation region having a top surface;
forming a semiconductor pyramid, wherein the semiconductor pyramid comprises four triangular surfaces joining at a tip, and the four triangular surfaces have (iii) surface planes, and the semiconductor pyramid has bases joined to the top surface of the isolation region, and the forming the semiconductor pyramid comprises:
forming a recess in the isolation region; and
growing a semiconductor material in the recess, wherein the semiconductor material is grown starting from a semiconductor substrate underlying the isolation region, and a top portion of the semiconductor material forms the semiconductor pyramid; and
performing an epitaxy to grow a III-V compound semiconductor film from the semiconductor pyramid.

11. The method of claim 10, wherein the III-V compound semiconductor film starts to be grown when the bases of the semiconductor pyramid are joined to the top surface of the isolation region.

12. The method of claim 10, wherein the forming the semiconductor pyramid comprises growing a semiconductor material until the semiconductor pyramid has the bases level with the top surface of the isolation region.

13. The method of claim 10, wherein the recess has a V-shaped bottom.

14. The method of claim 13, wherein the V-shaped bottom of the recess extends into the semiconductor substrate.

15. The method of claim 10 further comprising performing a planarization on the III-V compound semiconductor film.

16. A method comprising:
forming an isolation region in a semiconductor substrate, with portions of the semiconductor substrate in, and separate from each other by, portions of the isolation region;
removing the portions of the semiconductor substrate to form recesses in the isolation region, wherein the recesses comprises V-grooves extending into the semiconductor substrate;
epitaxially growing a semiconductor material in the recesses until top portions of the semiconductor material form pyramids; and
epitaxially growing a III-V compound semiconductor film starting from the pyramids, wherein the semiconductor material and the III-V compound semiconductor film are formed of different materials.

17. The method of claim 16, wherein when the growing the III-V compound semiconductor film is started, bases of the pyramids are not lower than a top surface of the isolation region.

18. The method of claim 17, wherein when the epitaxially growing the III-V compound semiconductor film is started, bases of the pyramids is level with the top surface of the isolation region.

19. The method of claim 16, wherein the epitaxially growing the semiconductor material is performed at a first temperature, and the growing the III-V compound semiconductor film is performed at a second temperature higher than the first temperature.

20. The method of claim 16, wherein the epitaxially growing the semiconductor material comprises growing GaN, with the GaN forming the pyramids.

* * * * *

UNITED STATES PATENT AND TRADEMARK OFFICE
CERTIFICATE OF CORRECTION

PATENT NO. : 9,870,920 B2  
APPLICATION NO. : 14/926976  
DATED : January 16, 2018  
INVENTOR(S) : Chih-Hsin Ko Page 1 of 1

It is certified that error appears in the above-identified patent and that said Letters Patent is hereby corrected as shown below:

In the Claims

In Column 7, Line 22, Claim 10, delete "(iii)" and insert --(111)--.

Signed and Sealed this
Tenth Day of April, 2018

Andrei Iancu
*Director of the United States Patent and Trademark Office*